(12) United States Patent
Otsubo et al.

(10) Patent No.: US 11,699,670 B2
(45) Date of Patent: Jul. 11, 2023

(54) HIGH-FREQUENCY MODULE

(71) Applicant: Murata Manufacturing Co., Ltd., Kyoto (JP)

(72) Inventors: Yoshihito Otsubo, Kyoto (JP); Akihiro Fujii, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 426 days.

(21) Appl. No.: 16/773,100

(22) Filed: Jan. 27, 2020

(65) Prior Publication Data

US 2020/0161259 A1    May 21, 2020

Related U.S. Application Data

(63) Continuation of application No. PCT/JP2018/028649, filed on Jul. 31, 2018.

(30) Foreign Application Priority Data

Aug. 1, 2017    (JP) .................................. 2017-148851

(51) Int. Cl.
   *H01L 23/66* (2006.01)
   *H01L 23/29* (2006.01)
   (Continued)

(52) U.S. Cl.
   CPC .............. *H01L 23/66* (2013.01); *H01L 23/29* (2013.01); *H01L 23/3121* (2013.01);
   (Continued)

(58) Field of Classification Search
   None
   See application file for complete search history.

(56) References Cited

U.S. PATENT DOCUMENTS

| 5,616,957 | A | 4/1997 | Kajihara |
| 2005/0045369 | A1* | 3/2005 | Ishimaru ............. H01L 23/4334 174/250 |

(Continued)

FOREIGN PATENT DOCUMENTS

| JP | H07321252 A | 12/1995 |
| JP | 2006-202885 A | 8/2006 |

(Continued)

OTHER PUBLICATIONS

English Machine Translation of JP-201325132 . No Date.*
International Search Report for International Application No. PCT/JP2018/028649 dated Sep. 18, 2018.
Written Opinion for International Application No. PCT/JP2018/028649 dated Sep. 18, 2018.

*Primary Examiner* — Hrayr A Sayadian
(74) *Attorney, Agent, or Firm* — Pearne & Gordon LLP

(57) ABSTRACT

A module that improves heat-dissipation efficiency and can prevent a warp and a deformation of the module is provided. A module includes a substrate, a first component mounted on an upper surface of the substrate, a heat-dissipation member, and a sealing resin layer that seals the first component and the heat-dissipation member. The heat-dissipation member is formed to be larger than the area of the first component when viewed in a direction perpendicular to the upper surface of the substrate and prevents heat generation of the module by causing the heat generated from the first component to move outside the module. The heat-dissipation member has through holes, and the through holes are packed with a resin, which can prevent the sealing resin layer from peeling off.

13 Claims, 9 Drawing Sheets

(51) Int. Cl.
  *H01L 23/31* (2006.01)
  *H01L 23/538* (2006.01)
  *H01L 23/544* (2006.01)
  *H05K 1/02* (2006.01)
  *H05K 3/34* (2006.01)
  *H05K 9/00* (2006.01)

(52) U.S. Cl.
  CPC ........ *H01L 23/5383* (2013.01); *H01L 23/544* (2013.01); *H05K 1/0209* (2013.01); *H05K 3/341* (2013.01); *H05K 9/0088* (2013.01); H01L 2223/54433 (2013.01); H01L 2223/6644 (2013.01); H01L 2924/14 (2013.01); H01L 2924/3025 (2013.01)

(56) References Cited

U.S. PATENT DOCUMENTS

| | | | |
|---|---|---|---|
| 2008/0019112 A1 | 1/2008 | Hatanaka et al. | |
| 2010/0328638 A1* | 12/2010 | Ishida | G03F 7/7005 |
| | | | 257/E33.056 |
| 2018/0301422 A1* | 10/2018 | Yamauchi | H01L 23/3114 |
| 2019/0274212 A1* | 9/2019 | Otsubo | H05K 1/0216 |
| 2019/0274237 A1* | 9/2019 | Otsubo | H05K 3/284 |

FOREIGN PATENT DOCUMENTS

| | | | |
|---|---|---|---|
| JP | 4903576 B2 | | 3/2012 |
| JP | 2013-251323 A | | 12/2013 |
| JP | 2013251323 A | * | 12/2013 |
| JP | 2015-211105 A | | 11/2015 |

\* cited by examiner

HIGH-FREQUENCY MODULE

This is a continuation of International Application No. PCT/JP2018/028649 filed on Jul. 31, 2018 which claims priority from Japanese Patent Application No. 2017-148851 filed on Aug. 1, 2017. The contents of these applications are incorporated herein by reference in their entireties.

BACKGROUND

Technical Field

The present disclosure relates to a module that includes a substrate on which a heat-generating component is mounted and that has a heat-dissipation structure.

Some high-frequency modules loaded in portable terminal devices and the like are provided with a shield layer for shielding from electromagnetic waves. In some modules of such a type, a component mounted on a wiring substrate is covered with a mold resin, and a shield layer is provided so as to cover the surface of the mold resin. As a high-frequency module provided with such a shield layer, for example, Patent Document 1 discloses an electronic component module 100, illustrated in FIG. 13.

The electronic component module 100 has a structure in which an IC device 102 mounted on a wiring substrate 101 is covered with a sealing resin layer 103 and a shield layer 104 is formed on the surface of the sealing resin layer 103. The sealing resin layer 103 includes a window portion 103a at a location overlapping the IC device 102 in plan view, and the shield layer 104 is formed so as to cover the entire surface of the sealing resin layer 103 and to adhere to an upper surface 102a of the IC device 102 exposed from the window portion 103a. The thus disposed shield layer 104 causes electromagnetic waves not to easily enter circuit wiring constituting an oscillation circuit and an amplifier circuit in the IC device 102, which stabilizes operation of the electronic component module. In addition, the heat generated from the IC device 102 is dissipated to the outside of the electronic component module 100 through the shield layer 104, and the operation of the electronic component module 100 is thus further stabilized.

Patent Document 1: Japanese Patent No. 4903576 (refer to paragraphs 0015 to 0022 and FIG. 3)

BRIEF SUMMARY

Heat dissipation may be, however, insufficient in the structure in which the shield layer 104 is in contact with only a portion of the upper surface 102a of the IC device 102, as with the aforementioned electronic component module 100. Meanwhile, when the shield layer 104 is formed so as to cover the entire upper surface of the IC device 102, due to a difference in a coefficient of linear expansion between the shield layer and the sealing resin, the shield layer and the resin may separate from each other.

The present disclosure provides a module capable of improving heat-dissipation efficiency of the module and preventing separation.

A module according to the present disclosure includes: a substrate; a first component mounted on a major surface of the substrate; a heat-dissipation member disposed in contact with a surface of the first component opposite to a surface of the first component facing the major surface of the substrate; and a sealing resin layer sealing the major surface of the substrate, the first component, and the heat-dissipation member, in which the heat-dissipation member has an area larger than that of the first component when viewed in a direction perpendicular to the major surface of the substrate, in which the heat-dissipation member has a plurality of through holes in a region that does not overlap the first component when viewed in the direction perpendicular to the major surface of the substrate, and in which a resin constituting the sealing resin layer is also packed (filled) in the plurality of through holes.

According to this configuration, it is possible to improve heat dissipation of the module because the entire upper surface of the component is in contact with the heat-dissipation member. It is thus possible to suppress a warp and a deformation of the module, and characteristic variation of the module can be also suppressed. Moreover, as a result of the heat-dissipation member having the through holes and the through holes being also packed (filled) with a resin, the sealing resin layer in contact with the upper surface and the lower surface of the heat-dissipation member is formed without necessarily being divided, and it is thus possible to prevent the sealing resin layer from peeling off from the heat-dissipation member.

A second component mounted on the major surface of the substrate may be further included, a height of the second component from the major surface may be higher than a height of the first component from the major surface, one of the plurality of through holes may be formed to be larger than the second component when viewed in the direction perpendicular to the major surface of the substrate, and the second component may be disposed to be inserted into the through hole formed to be larger than the second component. According to this configuration, when a plurality of components that differ from each other in height are mounted on the substrate and a component that requires heat dissipation is a component having a height lower than those of the other components, it is possible to improve heat-dissipation efficiency by causing the heat-dissipation member to be in contact with only the component that requires heat dissipation.

A third component mounted on the major surface of the substrate may be further included, a height of the third component from the major surface may be lower than a height of the first component from the major surface, the heat-dissipation member may be in contact with a surface of the third component opposite to a surface of the third component facing the major surface of the substrate, directly or with another heat-dissipation member interposed therebetween. According to this configuration, it is possible to efficiently perform heat dissipation when a plurality of components that require heat dissipation and that differ from each other in height are mounted on the substrate.

The sealing resin layer may have an abutting surface abutting on the major surface of the substrate, an opposite surface opposing to the abutting surface, and a side surface connecting edges of the abutting surface and the opposite surface to each other. A shield layer that covers at least the facing surface and the side surface of the sealing resin layer may be further included. The heat-dissipation member may include a portion that is exposed at the side surface of the sealing resin layer and that is in contact with the shield layer. According to this configuration, heat dissipation with the shortest distance is enabled depending on a mounted location of the component on the substrate by exposing the heat-dissipation member at the side surface of the module, and it is possible to improve heat-dissipation efficiency.

A plurality of connection conductors formed at the sealing resin layer may be further included, and the connection conductors may connect the shield layer and the heat-dissipation member to each other with a conductive material disposed between the opposite surface of the sealing resin layer and the heat-dissipation member. According to this configuration, it is possible to further improve heat-dissipation efficiency due to heat dissipation from the side surface and the upper surface of the module. Moreover, when components that require heat dissipation and that differ from each other in height are mounted inside the module, it is possible to perform heat dissipation at a time by attaching heat-dissipation fins to the upper surface of the module.

At a location in the sealing resin layer, the location not overlapping the plurality of through holes when viewed in the direction perpendicular to the major surface of the substrate, a recessed portion that constitutes an identification character or an identification mark may be formed. According to this configuration, a recessed portion that constitutes an identification character or an identification mark can be also formed in a location where a component is mounted because the component is covered with a heat-dissipation substance.

According to the present disclosure, the entire upper surface of the heat-generating component is in contact with the heat-dissipation member, and it is thus possible to improve heat dissipation of the module, to suppress characteristic variation of the module, and to prevent a warp and a deformation of the module. Moreover, due to the heat-dissipation member having the through holes and the through holes being packed (filled) with the resin, it is possible to prevent the sealing resin layer from peeling off from the heat-dissipation member.

DETAILED DESCRIPTION

First Embodiment

Figure 1:
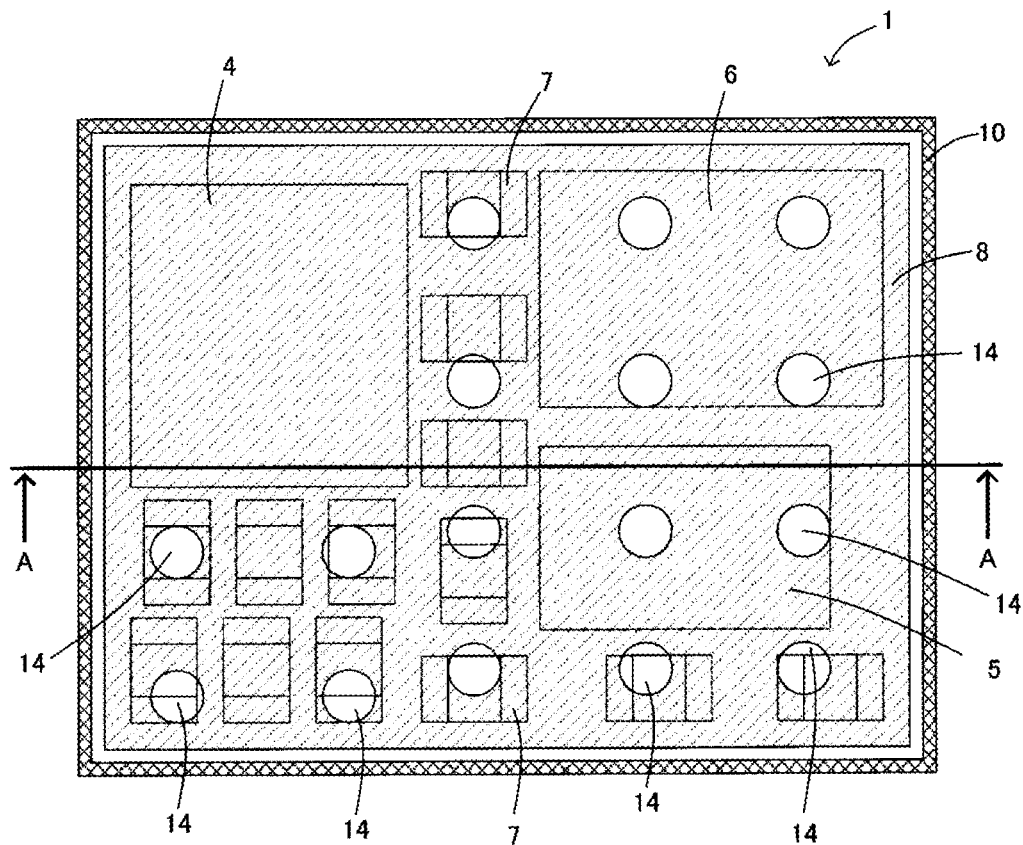
FIG. 1 is a plan view of a module according to a first embodiment of the present disclosure.
Figure 2:
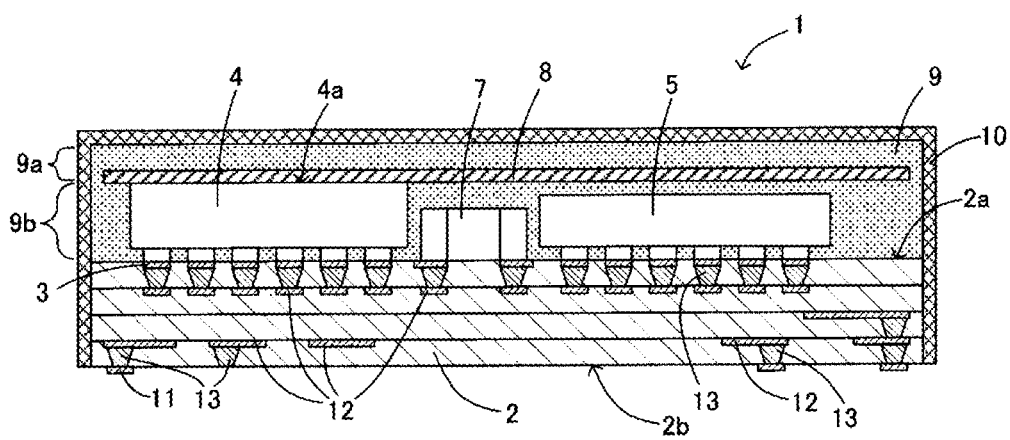
FIG. 2 is a sectional view of the module according to the first embodiment of the present disclosure.

A module 1 according to a first embodiment of the present disclosure will be described with reference to FIG. 1 and FIG. 2. FIG. 1 is a plan view of the module 1 according to the first embodiment, and FIG. 2 is a sectional view in the direction of the arrows A-A of FIG. 1. In FIG. 1, the top surface portion of a shield layer 10 is not illustrated.

The module 1 according to the first embodiment is configured to be loaded on, for example, a mother substrate or the like of an electronic device. As illustrated in FIG. 2, the module 1 includes: a substrate 2 having an upper surface 2a (corresponding to the "major surface" of the present disclosure) on which land electrodes 3 are formed; a first component 4 and components 5 to 7 mounted on the upper surface 2a such that respective connection terminals are connected to the land electrodes 3; a heat-dissipation member 8 for dissipating the heat generated from the first component 4; a sealing resin layer 9 that seals the upper surface 2a of the substrate 2, the components 4 to 7, and the heat-dissipation member 8; and the shield layer 10 that covers the surface of the sealing resin layer 9.

The substrate 2 is formed of, for example, a low-temperature co-firing ceramic, a glass epoxy resin, or the like. A plurality of the land electrodes 3 are formed on the upper surface 2a of the substrate 2, a plurality of outer electrodes 11 are formed on a lower surface 2b of the substrate 2, and a plurality of ground electrodes (not illustrated), a plurality of wiring electrodes 12, a plurality of via conductors 13, and the like are formed at the surface layer and the inner layer of the substrate 2. The ground electrodes are formed, for example, so as to be exposed from a side surface of the substrate 2.

The land electrodes 3, the outer electrodes 11, the ground electrodes, and the wiring electrodes 12 are each formed of a metal, such as Cu, Ag, Al, or the like, commonly employed as an electrode. The via conductors 13 are formed of a metal, such as Ag, Cu, or the like.

The first component 4 is a heat-generating component, and an example thereof is an active component, such as an IC, a power amplifier, or the like. The first component 4 is mounted on the upper surface 2a of the substrate 2 as a result of the connection terminal thereof being connected with solder to the land electrodes 3 formed on the upper surface 2a of the substrate 2.

The components 5 to 7 are, for example, passive components, such as an inductor, a capacitor, and the like, and mounted on the upper surface 2a of the substrate 2 as a result of the respective connection terminals being connected with solder to the land electrodes 3 formed on the upper surface 2a of the substrate 2.

The heat-dissipation member 8 is disposed so as to be in contact with an entire surface of an upper surface 4a of the first component 4 and to cover, in plan view, a substantially entire surface of the upper surface 2a of the substrate 2. The heat-dissipation member and the first component may not be in contact with each other at a portion provided that the heat-dissipation member and the first component are thermally coupled to each other such that generated heat is sufficiently transmitted. As illustrated in FIG. 1, the heat-dissipation member 8 has a plurality of through holes 14 at locations that do not overlap the first component 4 in plan view, the through holes 14 being packed with a resin, which forms a structure in which an upper section 9a and a lower section 9b of the sealing resin layer 9 are connected to each other by the resin packed in the through holes 14. Consequently, it is possible to prevent the sealing resin layer 9 from peeling off at the interface between the sealing resin layer 9 and the heat-dissipation member 8. The heat-dissipation member 8 can be formed of a high thermal conductivity substance, such as a metal foil, a metal plate, a high thermal conductivity film, a conductive paste, or the like. In this embodiment, the heat-dissipation member 8 is in contact with only the upper surface 4a of the first component 4 and is not in contact with the other components 5 to 7 because the height of the first component 4 from the upper surface 2a of the substrate 2 is higher than those of the other components 5 to 7.

The sealing resin layer 9 is disposed at the substrate 2 so as to cover the upper surface 2a of the substrate 2, the components 4 to 7, and the heat-dissipation member 8. The sealing resin layer 9 can be formed of a resin, such as a silica filler-containing epoxy resin or the like, commonly employed as a sealing resin. For high heat conduction, a filler, such as an alumina filler, having high thermal conductivity may be used.

The shield layer 10 is for shielding the wiring electrodes 12 in the substrate 2, the ground electrodes, and the components 4 to 7 from electromagnetic waves from outside and is laminated on the sealing resin layer 9 so as to cover the surface of the sealing resin layer 9 and the side surface of the substrate 2. The shield layer 10 is electrically connected to the ground electrodes exposed at the side surface of the substrate 2.

The shield layer 10 can be formed by a multilayer structure that includes a close-contact film laminated on the surface of the sealing resin layer 9, a conductive film laminated on the close-contact film, and a protective film laminated on the conductive film. The close-contact film is disposed to increase close-contact strength between the conductive film and the sealing resin layer 9 and can be formed of, for example, a metal, such as SUS. The close-contact film may be Ti, Cr, Ni, TiAl, or the like. The conductive film is a layer that bears a substantial shielding function of the shield layer 10 and can be formed of, for example, a metal of Cu, Ag, or Al. The protective film is disposed for preventing the conductive film from corroding and being damaged and can be formed of, for example, SUS. The protective film may be Ti, Cr, Ni, TiAl, or the like.

(Method of Manufacturing Module)

Next, a method of manufacturing the module 1 will be described. In the first embodiment, an aggregate of a plurality of the modules 1 is formed and thereafter divided to thereby manufacture the modules 1.

First, an aggregate of the substrates 2, each including a plurality of the land electrodes 3 formed on the upper surface 2a, a plurality of the outer electrodes 11 formed on the lower surface 2b, and a plurality of ground electrodes, a plurality of wiring electrodes 12, and a plurality of via conductors 13, and the like that are formed at the surface layer or the inner layer is prepared. The land electrodes 3, the outer electrodes 11, the ground electrodes, and the wiring electrodes 12 can be each formed by, for example, performing screen printing with a conductive paste that contains a metal, such as Cu, Ag, Al, or the like. The via conductors 13 can be formed by a known method after forming via holes with laser or the like.

Next, the components 4 to 7 are mounted on the upper surface 2a of the substrate 2 by using a known surface mount technology. For example, plating is formed on, of the land electrodes 3 on the substrate 2, desired land electrodes 3, solder is further formed thereon, the components 4 to 7 are mounted on, of the land electrodes 3 on which solder is formed, corresponding land electrodes 3, and thereafter, reflow treatment is performed. After the reflow treatment, cleaning of the aggregate of the substrates 2 is performed, as necessary.

Next, the heat-dissipation member 8 is formed so as to be in contact with the upper surface 4a of the first component 4. The heat-dissipation member 8 can be formed by, for example, disposing a metal foil or a metal plate provided with the through holes 14, on the upper surface 4a of the first component 4. Thereafter, the sealing resin layer 9 is formed so as to cover the upper surface 2a of the substrate 2, the components 4 to 7, and the heat-dissipation member 8. At this time, the through holes 14 in the heat-dissipation member 8 are also packed with (filled with) a resin, and the sealing resin layer 9 is formed, without necessarily being divided by the heat-dissipation member 8, such that the upper section 9a and the lower section 9b of the sealing resin layer 9 are connected to each other by the resin packed in the through holes 14.

The sealing resin layer 9 can be formed by using, for example, a transfer mold method, a compression mold method, a liquid resin method, a sheet resin method, or the like. A common silica filler-containing epoxy resin is usable in the sealing resin layer 9. For causing the sealing resin layer 9 to have high thermal conductivity, an epoxy resin containing a high thermal conductivity filler, such as an alumina filler, is usable. After the sealing resin layer 9 is formed, plasma cleaning of the substrate 2 may be performed, as necessary, to improve adhesion of the shield.

After the sealing resin layer 9 is formed, with a sputtering apparatus or a vacuum deposition apparatus, the shield layer 10 is formed so as to cover the surface of the sealing resin layer 9 and the side surface of the substrate 2. Thereafter, with a dicer or by a known method, such as laser machining, the modules 1 are divided from each other.

According to the aforementioned embodiment, the heat-dissipation member 8 is formed so as to cover the substantially entire surface of the substrate 2 when viewed in a direction perpendicular to the upper surface 2a of the substrate 2 and thus has a large heat dissipating area, which enables an improvement in heat-dissipation efficiency. Moreover, due to the entire upper surface of the heat generating component being in contact with the heat-dissipation member, heat dissipation of the module can be improved, characteristic variation of the module is suppressed, and a warp and a deformation of the module can be prevented. In addition, due to the heat-dissipation member 8 being provided with the through holes 14, the structure in which the upper section 9a and the lower section 9b of the sealing resin layer 9 are connected to each other by the resin packed in the through holes 14 is formed, which can prevent the sealing resin layer 9 from peeling off from the heat-dissipation member 8.

Second Embodiment

Figure 3:
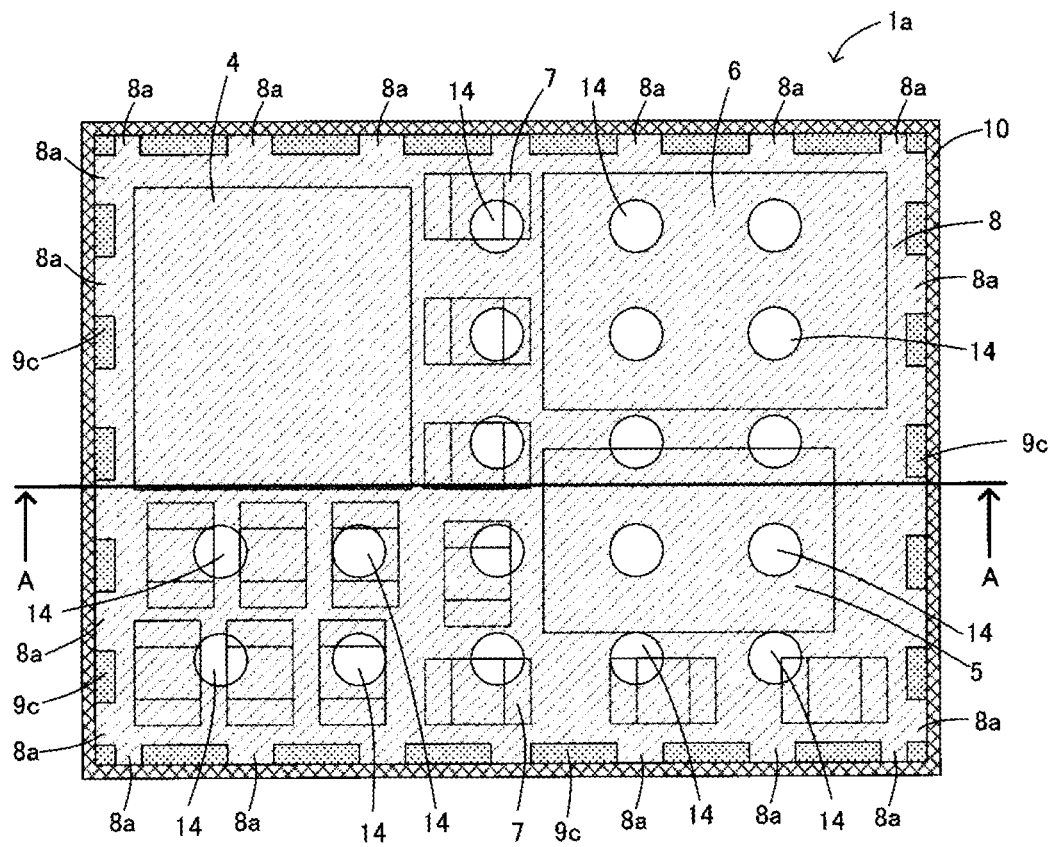
FIG. 3 is a plan view of a module according to a second embodiment of the present disclosure.
Figure 4:
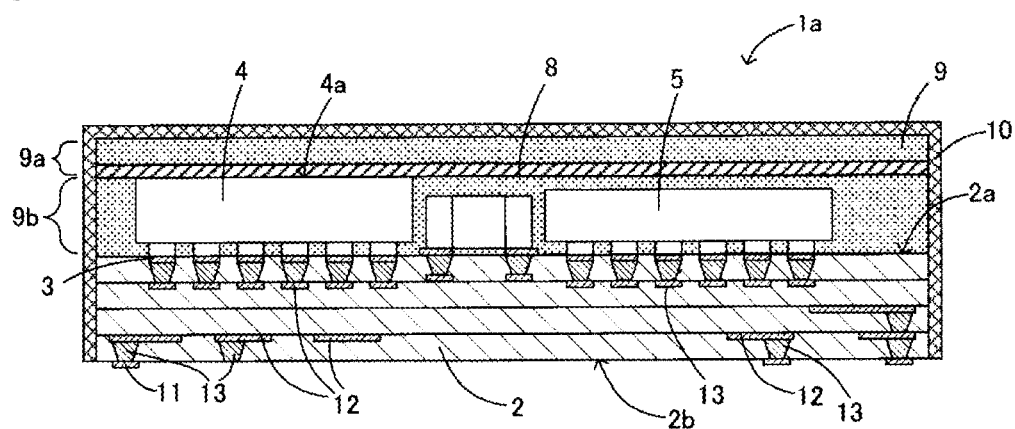
FIG. 4 is a sectional view of the module according to the second embodiment of the present disclosure.

A module 1a according to a second embodiment of the present disclosure will be described with reference to FIG. 3 and FIG. 4. FIG. 3 is a plan view of the module 1a according to the second embodiment, and FIG. 4 is a sectional view in the direction of the arrows A-A of FIG. 3. In FIG. 3, the top surface portion of the shield layer 10 is not illustrated.

The module 1a according to the second embodiment differs from the module 1 according to the first embodiment described with FIG. 1 and FIG. 2 in terms of the peripheral portion of the heat-dissipation member 8 being in contact with the shield layer 10, as illustrated in FIG. 3. Other configurations are identical to those of the module 1 according to the first embodiment, and description thereof is thus omitted by giving identical signs thereto.

The heat-dissipation member 8 includes, at the periphery thereof, a plurality of extended portions 8a projecting outward when viewed in the direction perpendicular to the upper surface 2a of the substrate 2, and the extended portions 8a are disposed so as to be in contact with the shield layer 10. Gaps between the extended portions 8a are also packed (filled), as with the through holes 14, with a resin.

According to the aforementioned embodiment, the same effect as that in the module 1 according to the first embodiment can be obtained, and heat dissipation to the side surface is enabled, which achieves an improvement in heat-dissipation efficiency because heat dissipation can be performed with the shortest distance depending on the arrangement of the components in the module. When connection portions 9c that connect the upper section 9a and the lower section 9b of the sealing resin layer 9 to each other are present between the extended portions 8a of the heat-dissipation member 8, the through holes 14 of the heat-dissipation member 8 may not be present at a center portion of the heat-dissipation member 8.

Third Embodiment

Figure 5:
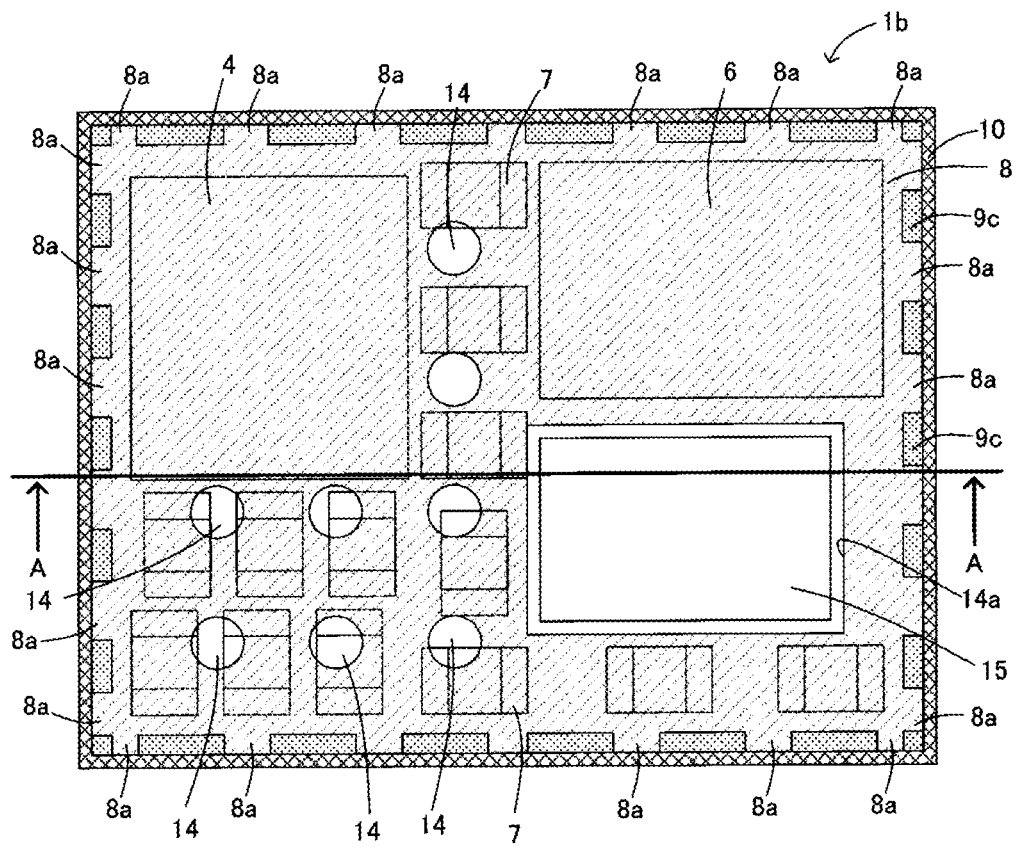
FIG. 5 is a plan view of a module according to a third embodiment of the present disclosure.
Figure 6:
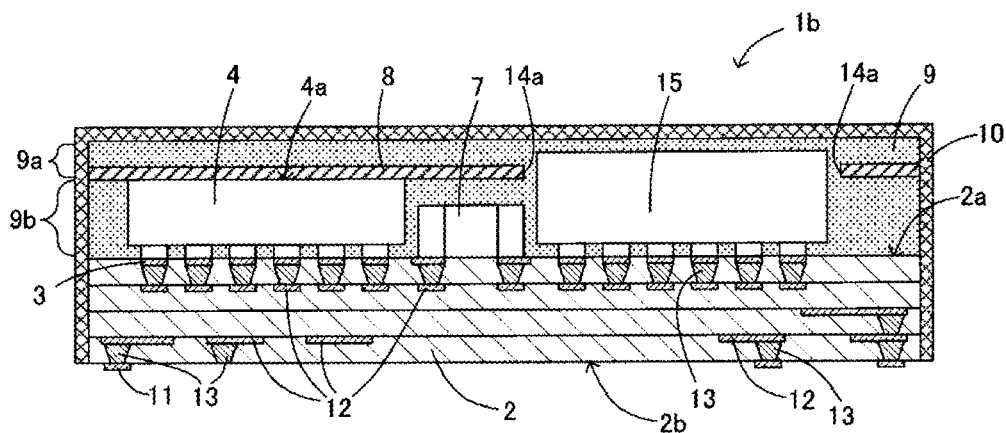
FIG. 6 is a sectional view of the module according to the third embodiment of the present disclosure.

A module 1b according to a third embodiment of the present disclosure will be described with reference to FIG. 5 and FIG. 6. FIG. 5 is a plan view of the module 1b according to the third embodiment, and FIG. 6 is a sectional view in the direction of the arrows A-A of FIG. 5. In FIG. 5, the top surface portion of the shield layer 10 is not illustrated.

The module 1b according to the third embodiment differs from the module 1 according to the first embodiment described with FIG. 1 and FIG. 2 in terms of that, as illustrated in FIG. 5 and FIG. 6, a second component 15, as an alternative to the component 5, whose height from the upper surface 2a of the substrate 2 is higher than that of the first component 4 is provided and a large through hole 14a into which the second component 15 is insertable is formed in the heat-dissipation member 8. Other configurations are identical to those of the module 1 according to the first embodiment, and description thereof is thus omitted by giving identical signs thereto.

As illustrated in FIG. 5 and FIG. 6, in the module 1b according to this embodiment, the second component 15 whose height from the upper surface 2a of the substrate 2 is higher than that of the first component 4 in contact with the heat-dissipation member 8 is mounted, and the through hole 14a larger than the area of the second component 15 is provided in the heat-dissipation member 8 so that the second component 15 does not come into contact with the heat-dissipation member 8. The second component 15 is inserted into the through hole 14a.

According to the aforementioned embodiment, the same effect as that in the module 1 according to the first embodiment can be obtained, and heat dissipation can be efficiently performed, even when, of the components mounted on the module 1b, the first component 4 that requires heat dissipation has a profile lower than those of the other components. Moreover, it is possible to suppress the influence of heat on the components that do not require heat dissipation but easily vary in characteristics due to heat.

Fourth Embodiment

Figure 7:
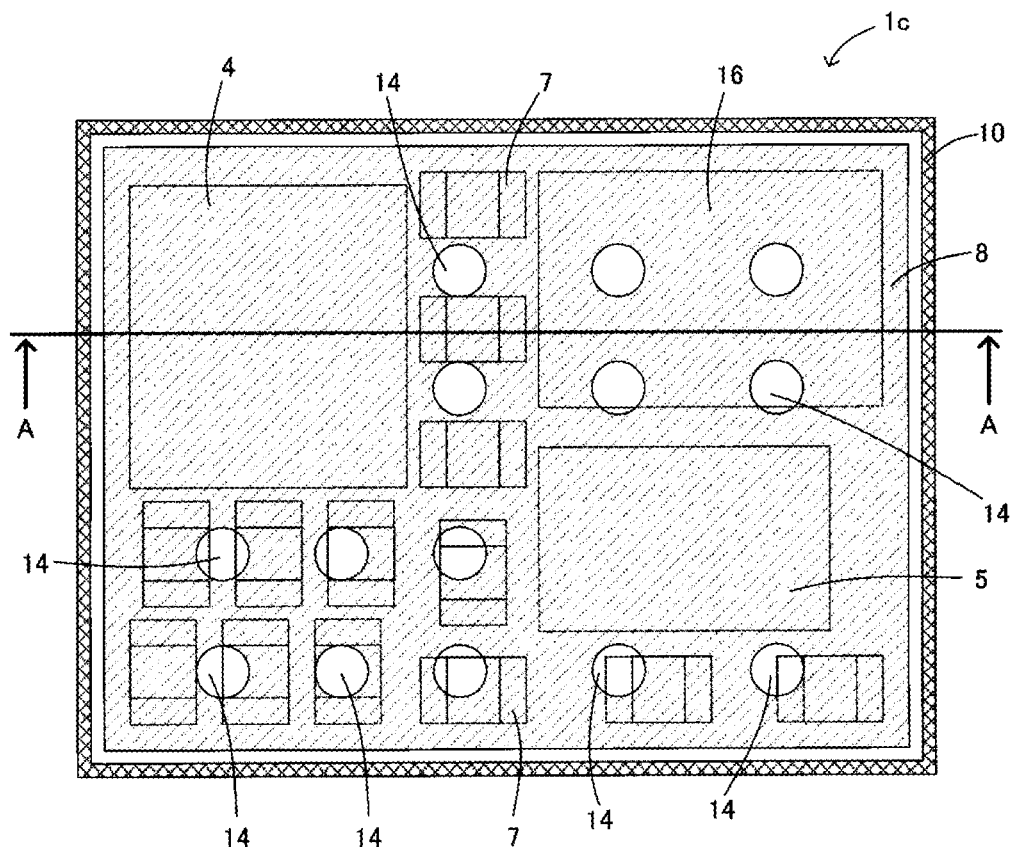
FIG. 7 is a plan view of a module according to a fourth embodiment of the present disclosure.
Figure 8:
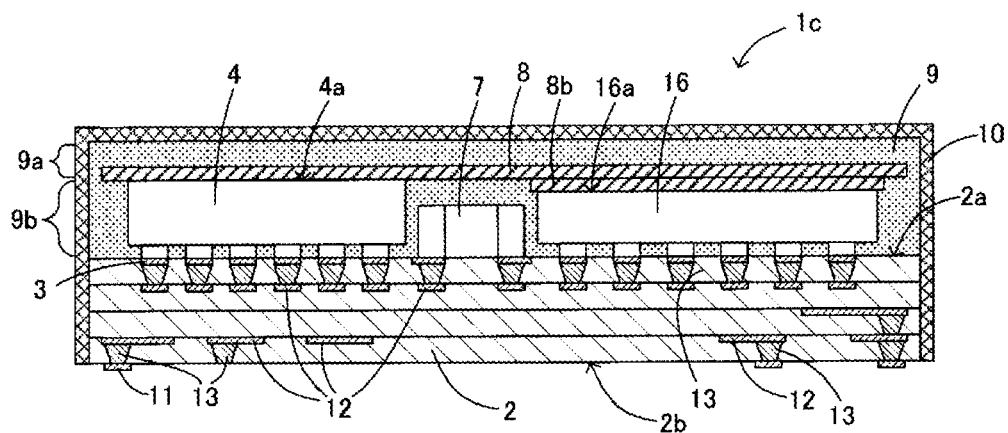
FIG. 8 is a sectional view of the module according to the fourth embodiment of the present disclosure.

A module 1c according to a fourth embodiment of the present disclosure will be described with reference to FIG. 7 and FIG. 8. FIG. 7 is a plan view of the module 1c according to the fourth embodiment, and FIG. 8 is a sectional view in the direction of the arrows A-A of FIG. 7. In FIG. 7, the top surface portion of the shield layer 10 is not illustrated.

The module 1c according to the fourth embodiment differs from the module 1 according to the first embodiment described with FIG. 1 and FIG. 2 in terms of that, as illustrated in FIG. 7 and FIG. 8, a third component 16, as an alternative to the component 6, whose height from the upper surface 2a of the substrate 2 is lower than that of the first component 4 is provided and the heat-dissipation member 8 is also in contact with the third component 16. The other configurations are identical to those of the module 1 according to the first embodiment, and description thereof is thus omitted by giving identical signs thereto.

In the module 1c of this embodiment, a heat-dissipation member 8b is disposed on an upper surface 16a of the third component 16 whose height from the upper surface 2a of the substrate 2 is lower than that of the first component 4, and the third component 16 and the heat-dissipation member 8 are in contact with each other with the heat-dissipation member 8b interposed therebetween. The heat-dissipation member 8b can be formed of, for example, the same metal foil or the same metal plate as that of the heat-dissipation member 8. The heat-dissipation member 8b can be formed integral with the heat-dissipation member 8 by forming the heat-dissipation members 8 and 8b with a conductive paste. The third component 16 is a heat-generating component, as with the first component 4, and an example thereof is an active component, such as an IC, a power amplifier, or the like.

According to the aforementioned embodiment, the same effect as that in the module 1 according to the first embodiment can be obtained, and heat dissipation can be efficiently performed even for a plurality of components that differ from each other in height.

Fifth Embodiment

Figure 9:
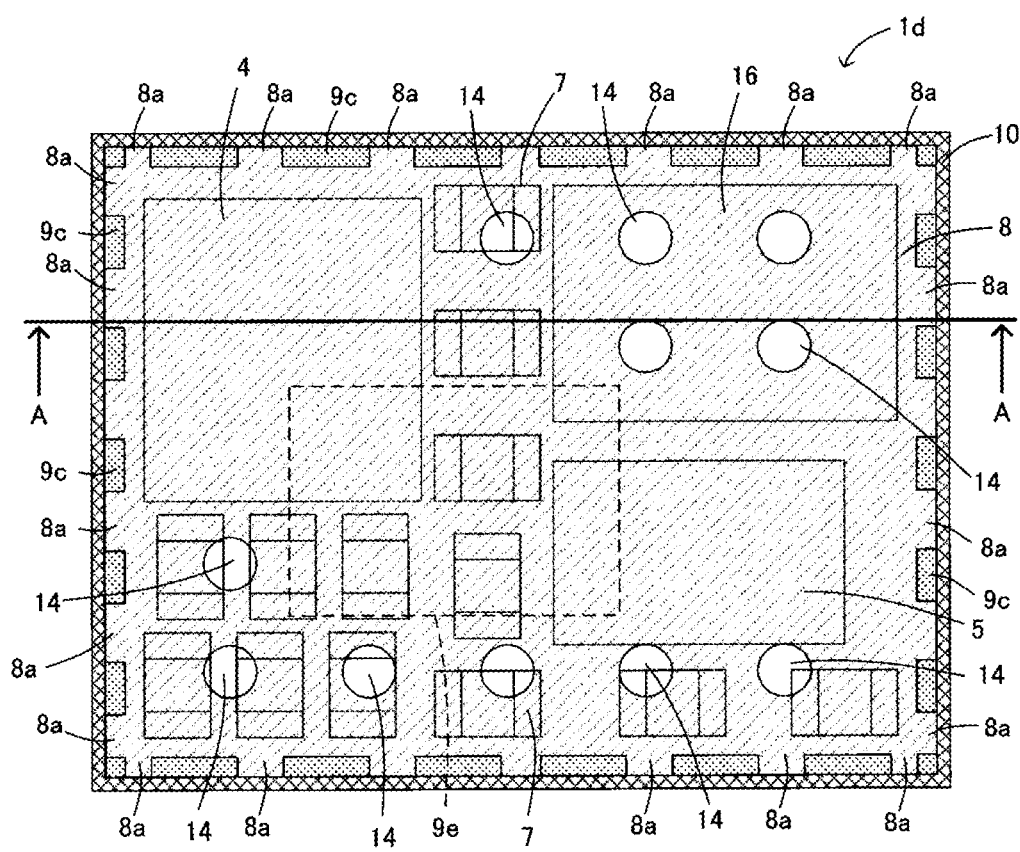
FIG. 9 is a plan view of a module according to a fifth embodiment of the present disclosure.
Figure 10A:
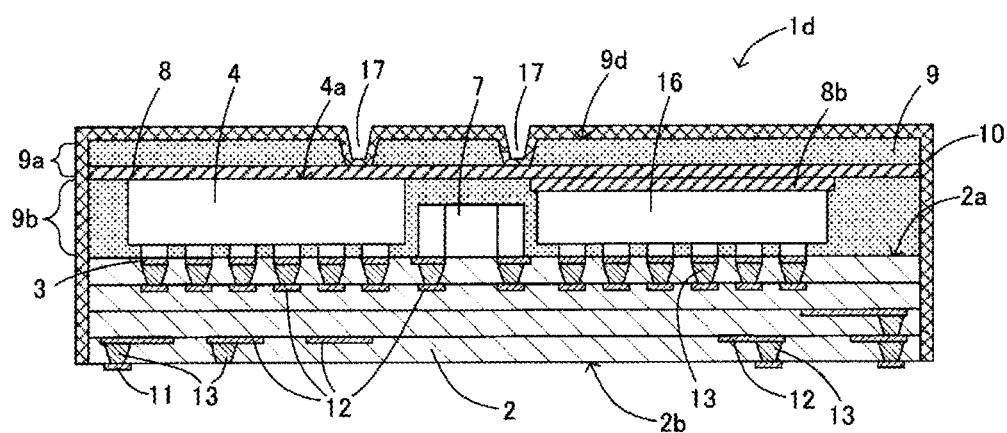
FIGS. 10A and 10B are sectional views of the module according to the fifth embodiment of the present disclosure.
Figure 10B:
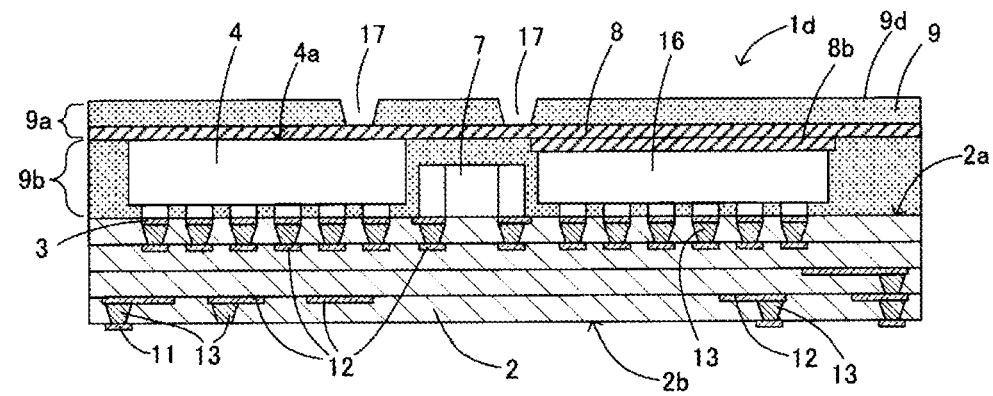

A module 1d according to a fifth embodiment of the present disclosure will be described with reference to FIG. 9, FIG. 10A, and FIG. 10B. FIG. 9 is a plan view of the module 1d according to the fifth embodiment, and FIGS. 10A and 10B are sectional views in the direction of the arrows A-A of FIG. 9. In FIG. 9, the top surface portion of the shield layer 10 is not illustrated.

The module 1d according to the fifth embodiment differs from the module 1c according to the fourth embodiment described with FIG. 7 and FIG. 8 in terms of that, as illustrated in FIG. 9, FIG. 10A, and FIG. 10B, an identification-mark formation area 9e is provided on an upper surface 9d of the sealing resin layer 9 and recessed portions 17 that constitute identification characters or identification marks are formed in the identification-mark formation area 9e. The other configurations are identical to those of the module 1 according to the first embodiment, and description thereof is thus omitted by giving identical signs thereto.

The module 1d of this embodiment has the identification-mark formation area 9e on the upper surface 9d of the sealing resin layer 9, and character strings, marks, and the like can be formed in the identification-mark formation area 9e by laser machining or the like. After the recessed portions 17 that constitute identification characters or identification marks are formed at the upper surface 9d of the sealing resin layer 9 by laser machining, the shield layer 10 may be formed, as illustrated in FIG. 10A, or no shield layer may be formed to expose the heat-dissipation member 8 from the recessed portions 17, as illustrated in FIG. 10B. The identification-mark formation area 9e can be provided at a location that does not overlap the through holes 14 when viewed in the direction perpendicular to the upper surface 2a of the substrate 2.

According to the aforementioned embodiment, even when the recessed portions 17 that constitute identification characters or identification marks are provided in the upper surface 9d of the sealing resin layer 9 by laser machining, the damage of the components mounted on the substrate 2 can be reduced because the heat-dissipation member 8 is disposed. For example, the damage of the components can be effectively suppressed when the heat-dissipation member 8 is a metal and marking is performed with laser. Moreover, visibility of identification characters and identification marks can be improved by exposing the heat-dissipation member from the recessed portions 17.

Sixth Embodiment

Figure 11:
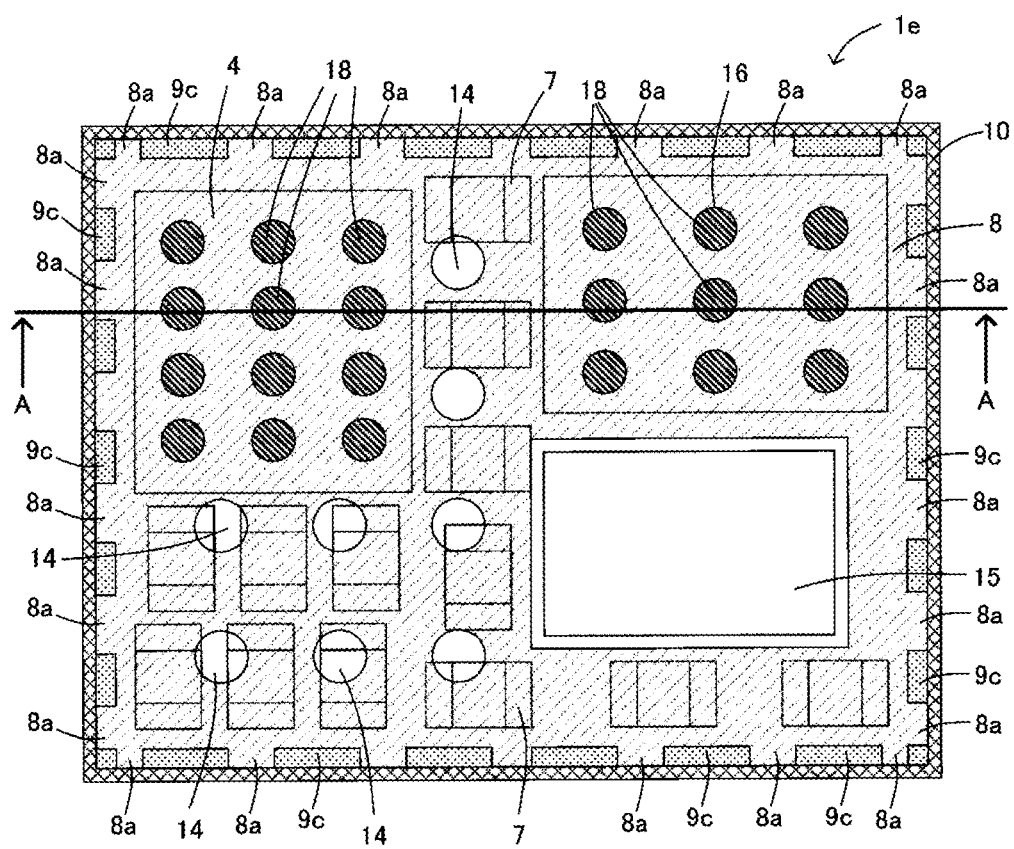
FIG. 11 is a plan view of a module according to a sixth embodiment of the present disclosure.
Figure 12A:
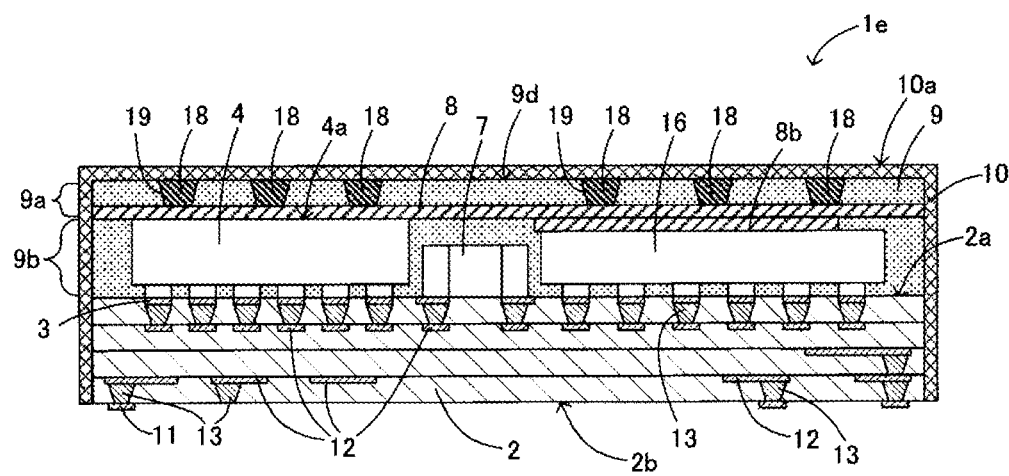
FIGS. 12A and 12B are sectional views of the module according to the sixth embodiment of the present disclosure.
Figure 12B:
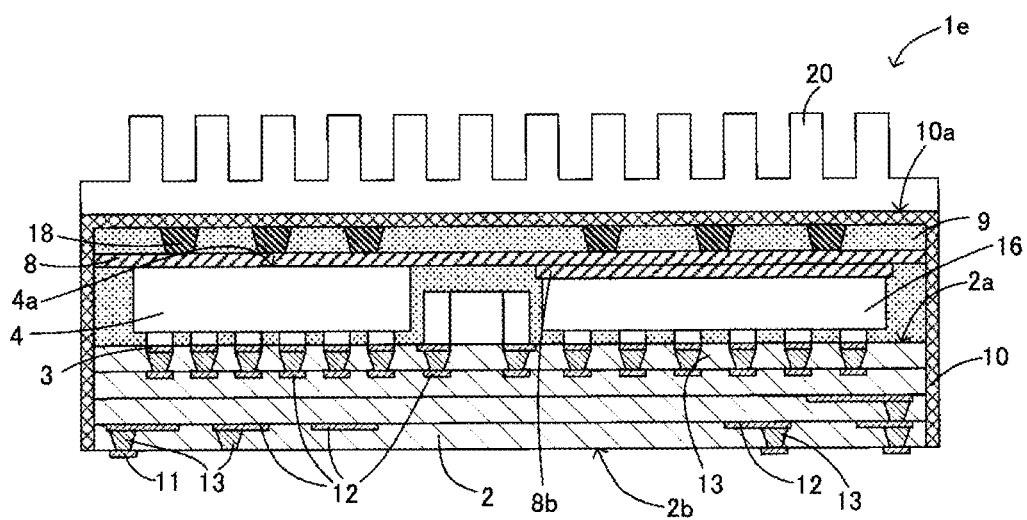
Figure 13:
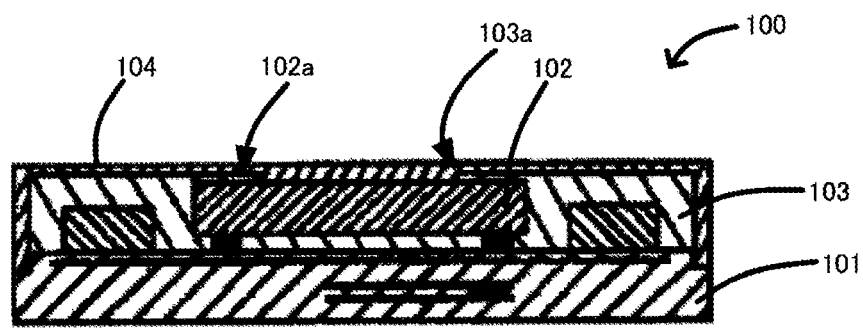
FIG. 13 is a sectional view of an existing module.

A module 1e according to a sixth embodiment of the present disclosure will be described with reference to FIG. 11, FIG. 12A, and FIG. 12B. FIG. 11 is a plan view of the module 1e according to the fifth embodiment, and FIGS. 12A and 12B are sectional views in the direction of the arrows A-A of FIG. 11. In FIG. 11, the top surface portion of the shield layer 10 is not illustrated.

The module 1e according to the sixth embodiment differs from the module 1c according to the fourth embodiment described with FIG. 7 and FIG. 8 in terms of a plurality of connection conductors 18 being disposed in the upper section 9a of the sealing resin layer 9 and connecting the shield layer 10 and the heat-dissipation member 8 to each other. The other configurations are identical to those of the module 1 according to the first embodiment, and description thereof is thus omitted by giving identical signs thereto.

In the module 1e of this embodiment, the shield layer 10 and the heat-dissipation member 8 are connected to each other by the plurality of connection conductors 18, and the heat generated from the first component 4 and the third component 16 can be also dissipated from an upper surface 10a of the shield layer 10. Moreover, as a modification of the sixth embodiment, a heat-dissipation fin 20 may be installed on the upper surface 10a of the shield layer 10, as illustrated in FIG. 12B.

The connection conductors 18 can be formed by, for example, after forming the sealing resin layer 9, forming holes 19 by laser machining until the heat-dissipation member 8 is exposed from the upper surface 9d of the sealing resin layer 9 and packing the holes 19 with a high thermal conductivity substance. After the connection conductors 18 are formed, the shield layer 10 is provided, and the heat-dissipation member 8 and the shield layer 10 are thereby connected to each other by the connection conductors 18.

According to the aforementioned embodiment, heat can be dissipated from the side surface and the top surface of the module, which can further improve heat-dissipation efficiency. Moreover, even when a plurality of components that differ from each other in height are mounted inside the module, heat dissipation can be performed at a time by using the same heat-dissipation fins.

Note that the present disclosure is not limited to the aforementioned embodiments and can be variously modified, in addition to the aforementioned modifications, within the spirit of the present disclosure.

INDUSTRIAL APPLICABILITY

The present disclosure is applicable to a module that includes a substrate on which a heat-generating component is mounted and that has a heat-dissipation structure.

REFERENCE SIGNS LIST 1, 1a to 1e module
2 substrate
2a upper surface (major surface)
4 first component
8, 8b heat-dissipation member
9 sealing resin layer
10 shield layer
14 through hole
15 second component
16 third component
17 recessed portion
18 connection conductor

The invention claimed is:

1. A high-frequency module comprising:
a substrate;
a first component mounted on a major surface of the substrate;
a heat-dissipation member disposed in contact with a surface of the first component opposite to a surface of the first component facing the major surface of the substrate; and
a sealing resin layer sealing the major surface of the substrate, the first component, and the heat-dissipation member,
wherein the heat-dissipation member has an area larger than an area of the first component when viewed in a direction perpendicular to the major surface of the substrate,
wherein the heat-dissipation member has a plurality of through holes in a region that does not overlap the first component when viewed in the direction perpendicular to the major surface of the substrate, and
wherein a resin constituting the sealing resin layer is also packed in the plurality of through holes.

2. The high-frequency module according to claim 1, further comprising:
a second component mounted on the major surface of the substrate,
wherein a height of the second component from the major surface is higher than a height of the first component from the major surface,
wherein one of the plurality of through holes is larger than the second component when viewed in the direction perpendicular to the major surface of the substrate, and
wherein the second component is disposed in the one of the plurality of the through holes that is larger than the second component.

3. The high-frequency module according to claim 1, further comprising:
a third component mounted on the major surface of the substrate,
wherein a height of the third component from the major surface is lower than a height of the first component from the major surface,
wherein the heat-dissipation member is in direct contact with a surface of the third component opposite to a surface of the third component facing the major surface of the substrate, or the heat-dissipation member is indirect contact with the surface of the third component opposite to the surface of the third component facing the major surface of the substrate through another heat-dissipation member interposed therebetween.

4. The high-frequency module according to claim 1,
wherein the sealing resin layer has an abutting surface abutting on the major surface of the substrate, an opposite surface opposing to the abutting surface, and a side surface connecting edges of the abutting surface and the opposite surface to each other,
wherein the high-frequency module further comprises a shield layer that covers at least the opposite surface and the side surface of the sealing resin layer, and
wherein the heat-dissipation member includes a portion that is exposed at the side surface of the sealing resin layer and that is in contact with the shield layer.

5. The high-frequency module according to claim 4,
wherein the high-frequency module further comprises a plurality of connection conductors at the sealing resin layer, and
wherein the connection conductors connect the shield layer and the heat-dissipation member to each other with a conductive material disposed between the opposite surface of the sealing resin layer and the heat-dissipation member.

6. The high-frequency module according to claim 1, wherein, at a location in the sealing resin layer not overlapping the plurality of the through holes when viewed in the direction perpendicular to the major surface of the substrate, a recessed portion that constitutes an identification character or an identification mark is provided.

7. The high-frequency module according to claim 2, further comprising:
a third component mounted on the major surface of the substrate,
wherein a height of the third component from the major surface is lower than a height of the first component from the major surface,
wherein the heat-dissipation member is in direct contact with a surface of the third component opposite to a surface of the third component facing the major surface of the substrate, or the heat-dissipation member is indirect contact with the surface of the third component opposite to the surface of the third component facing the major surface of the substrate through another heat-dissipation member interposed therebetween.

8. The high-frequency module according to claim 2,
wherein the sealing resin layer has an abutting surface abutting on the major surface of the substrate, an opposite surface opposing to the abutting surface, and a side surface connecting edges of the abutting surface and the opposite surface to each other,
wherein the high-frequency module further comprises a shield layer that covers at least the opposite surface and the side surface of the sealing resin layer, and
wherein the heat-dissipation member includes a portion that is exposed at the side surface of the sealing resin layer and that is in contact with the shield layer.

9. The high-frequency module according to claim 3,
wherein the sealing resin layer has an abutting surface abutting on the major surface of the substrate, an opposite surface opposing to the abutting surface, and a side surface connecting edges of the abutting surface and the opposite surface to each other,
wherein the high-frequency module further comprises a shield layer that covers at least the opposite surface and the side surface of the sealing resin layer, and
wherein the heat-dissipation member includes a portion that is exposed at the side surface of the sealing resin layer and that is in contact with the shield layer.

10. The high-frequency module according to claim 2, wherein, at a location in the sealing resin layer not overlapping the plurality of the through holes when viewed in the direction perpendicular to the major surface of the substrate, a recessed portion that constitutes an identification character or an identification mark is provided.

11. The high-frequency module according to claim 3, wherein, at a location in the sealing resin layer not overlapping the plurality of the through holes when viewed in the direction perpendicular to the major surface of the substrate, a recessed portion that constitutes an identification character or an identification mark is provided.

12. The high-frequency module according to claim 4, wherein, at a location in the sealing resin layer not overlapping the plurality of the through holes when viewed in the direction perpendicular to the major surface of the substrate, a recessed portion that constitutes an identification character or an identification mark is provided.

13. The high-frequency module according to claim 5, wherein, at a location in the sealing resin layer not overlapping the plurality of the through holes when viewed in the direction perpendicular to the major surface of the substrate, a recessed portion that constitutes an identification character or an identification mark is provided.

* * * * *